United States Patent [19]

Skudera, Jr. et al.

[11] Patent Number: 4,994,740
[45] Date of Patent: Feb. 19, 1991

[54] HIGH RESOLUTION, WIDE BAND CHIRP-Z SIGNAL ANALYZER

[75] Inventors: William J. Skudera, Jr., Oceanport, N.J.; Charles E. Konig, Staten Island, N.Y.

[73] Assignee: The United States of America as represented by the Secretary of the Army, Washington, D.C.

[21] Appl. No.: 411,752

[22] Filed: Sep. 25, 1989

[51] Int. Cl.$^5$ .................................................. G01R 23/16
[52] U.S. Cl. ................................ 324/77 B; 324/77 R; 324/79 R
[58] Field of Search .................... 455/1, 20; 324/77 R, 324/77 D, 77 E, 77 G, 77 H, 78 R, 78 E, 78 F, 78 Z, 83 R, 79 R, 79 D, 77 B

[56] References Cited
U.S. PATENT DOCUMENTS
4,357,709 11/1982 Butler et al. ............................ 455/20

Primary Examiner—Michael J. Tokar
Attorney, Agent, or Firm—Michael Zelenka; John M. O'Meara

[57] ABSTRACT

Wide band and narrow band Chirp-Z channels are interfaced to enhance signal analysis resolution for the signal's individual component wave forms over a wide signal bandwidth. The frequency characteristic of a selected component wave form is matched to the sweeping local oscillator and filter frequency parameters of the narrow band channel in accordance with the relative position occupied by the frequency characteristic of the selected component wave form in the frequency segregated time domain of said wide band channel. In one preferred embodiment, a mixer and a voltage controlled oscillator are utilized to accomplish the frequency matching and in another embodiment, a bandpass filter precisely defines the bandwidth of the selected component wave form. For still another embodiment, the voltage input to the voltage control oscillator is controlled in accordance with the difference in frequency between the selected component wave form and said narrow band channel.

10 Claims, 1 Drawing Sheet

HIGH RESOLUTION, WIDE BAND CHIRP-Z SIGNAL ANALYZER

The invention described herein may be manufactured, used, and licensed by or for the Government for governmental purposes without the payment to us of any royalties thereon.

BACKGROUND OF THE INVENTION

The present invention relates generally to signal analyzers and more particularly, to such analyzers which utilize the Chirp-Z transform.

Signal analyzers using the Chirp-Z transform have been well known, at least since R. M. Hays et al. presented SURFACE WAVE TRANSFORM ADAPTABLE PROCESSOR SYSTEM, pages 363-370 of the 1975 Ultrasonics Symposium Proceedings, IEEE Catalogue No. 75 CHO 994-4SU which is incorporated by reference herein. In applications such as radar, it is often necessary to analyze the component wave forms that are contained in a signal. Of course, each component wave form in the signal has its own frequency characteristic and a Chirp-Z signal analyzer operates over a predetermined signal bandwidth to present the signal's component wave forms in a frequency segregated time domain. Therefore, a Chirp-Z signal analyser actually separates the signal's component wave forms in time and permits each component wave form to be gated out or accessed with a time count in accordance with the relative position occupied by its frequency characteristic in the frequency segregated time domain. A Chirp-Z signal analyzer includes a sweeping local oscillator and a compression filter, each of which has a frequency parameter that must be predetermined in accordance with the signal bandwidth selected for analysis. For most signal analyzer applications, a very wide signal bandwidth is selected because it is desirable to capture as many component wave forms as possible for analysis. When performing such wide bandwidth analysis with conventional Chirp-Z signal analyzers, the sweeping local oscillator thereof must have a very fast sweep time to maximize bandwidth over which component wave forms in the signal are captured for analysis. However, such very fast sweep times result in very low resolution analysis due primarily to constraints resulting from the compression filter. If slower sweep times are utilized to obtain sufficiently high resolution analysis, the bandwidth is narrowed over which component wave forms in the signal are captured for analysis.

SUMMARY OF THE INVENTION

It is the general object of the present invention to combine a narrow band Chirp-Z channel with a wide band Chirp-Z channel in a signal analyzer and thereby provide for high resolution analysis over a wide bandwidth of component wave forms in the signal.

It is a specific object of the present invention to accomplish the above-stated general object by correlating operation of the channels through the establishment of frequency parameters in the narrow band channel according to the characteristics of selected component wave forms in the frequency segregated time domain of the wide band channel.

These and other objects are accomplished in accordance with the present invention by setting the sweeping local oscillator and filter frequency parameters of the narrow band channel and limiting the frequency characteristic of the signal input thereto, in accordance with the wide band channel frequency characteristics of the component wave form selected for analysis. In the preferred embodiments, the selected component wave form is obtained from the frequency segregated time domain output of the wide band channel to modify the signal at the input of the narrow band channel, in accordance with the position occupied by the frequency characteristic thereof in that domain.

The scope of the present invention is only limited by the appended claims for which support is predicated on the preferred embodiments hereinafter set forth in the following description and the attached drawing.

DESCRIPTION OF THE PREFERRED EMBODIMENTS

Figure 1:
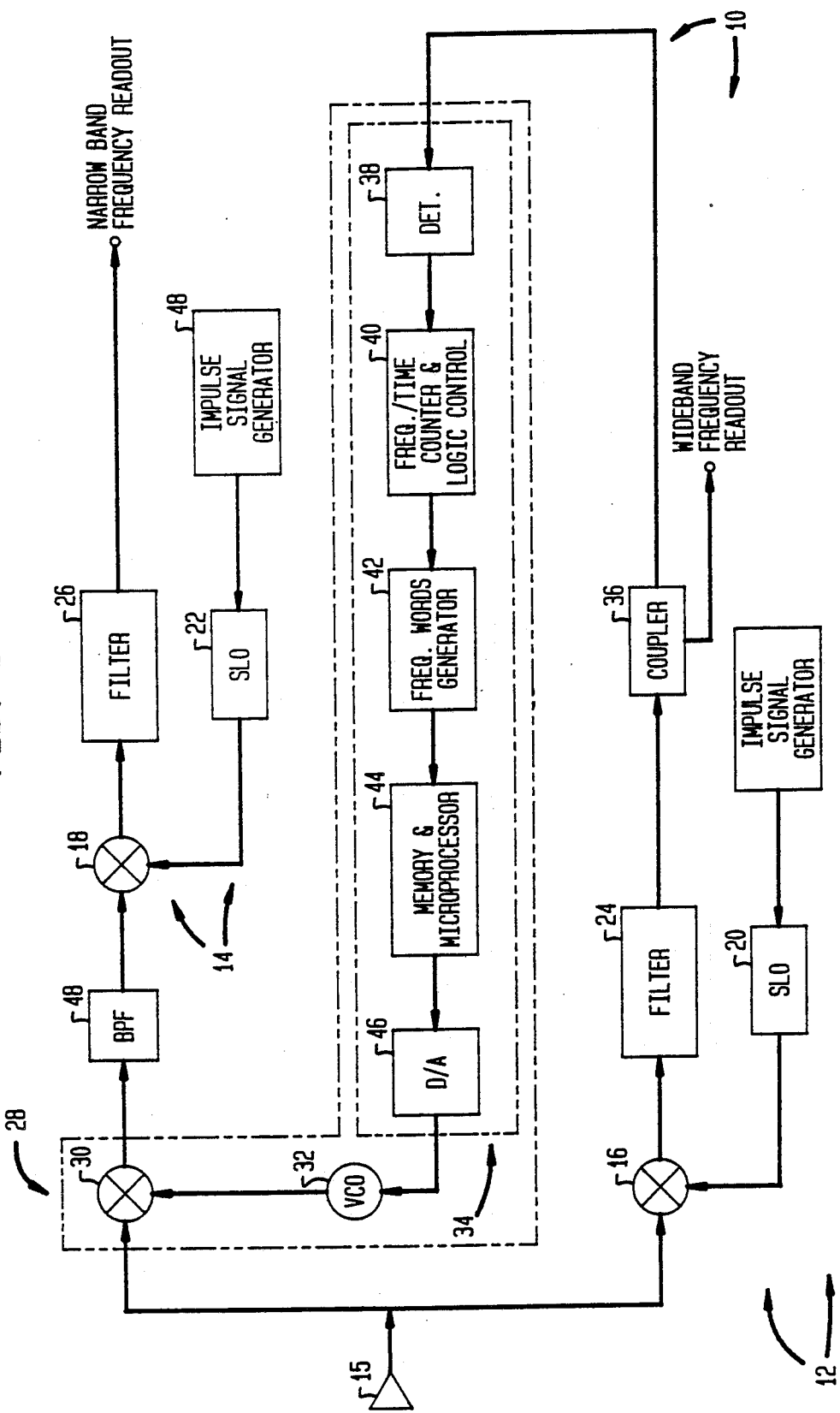
FIG. 1 is a block diagram illustration for the preferred embodiments of this invention wherein Chirp-Z channels are interfaced to enhance the resolution of signal analysis for a selected component wave form therein.

FIG. 1 relates to signal analyzer apparatus 10 having a conventional wide band Chirp-Z channel 12 interconnected with a conventional narrow band Chirp-Z channel 14, in accordance with the preferred embodiments of the invention. An antenna 15 directs an incoming signal to each channel 12 and 14 through separate inputs. The incoming signal contains a plurality of component wave forms that are analyzed separately by each of the channels 12 and 14 which individually include an input mixer 16 and 18 respectively. The signal inputs to each mixer 16 and 18 are individually mixed with output from a sweeping local oscillator (hereinafter SLO) 20 and 22 respectively, so that the frequency characteristics of the wave forms at the outputs from the individual mixers 16 and 18 are focused to the bandwidth of compression filters 24 and 26 respectively. Filters 24 and 26 are each connected to receive the wave forms from mixers 16 and 18 respectively, and have the parameters thereof predetermined to derive those wave forms in a frequency segregated time domain.

Channels 12 and 14 are interfaced through a means 28 for matching the frequency characteristic of a selected component wave form in the incoming signal to the frequency parameters of the narrow band channel 14. In one preferred embodiment of the invention, frequency matching means 28 includes a mixer 30 having the incoming signal applied thereto. The frequency output from a voltage controlled oscillator (hereinafter VCO) 32 is also applied to the mixer 30 and beats the incoming signal to derive the desired frequency match. To accomplish this match in one preferred embodiment, the VCO 32 is controlled to have an output frequency substantially equal to the difference between the frequency characteristic of the selected component wave form and the center frequency of the narrow band channel 14.

Means 34 is included in FIG. 1 for controlling the voltage input to the VCO 32 in accordance with the difference in frequency between the selected component wave form and the narrow band channel 14. Of course, all of the component wave forms in the incoming signal are available at the frequency segregated time domain output of the wide band channel 12 In accordance with well known techniques, these component wave forms are applied through a coupler 36 to derive a "frequency word" or digital code for each such component wave form received by the voltage control means 34. A video detector 38 receives the component wave forms and derives frequency related pulses therefrom which are applied to a frequency/time counter and logic control unit 40 to derive identifying information for the component wave forms using the known principal that the frequency characteristic of each component wave is proportional to that wave's relative position in the frequency segregated time domain of the wide band channel 12. Although unit 40 could include a single counter in limited applications of the invention, it would include a plurality of parallel counters in most applications thereof. This identifying information is applied to a frequency word generator 42 which outputs a digital code for each component wave form identified. In accordance with one preferred embodiment of the invention a memory and microprocessor unit 44 receives these digital codes and controls a D/A converter 46 to derive an input voltage level for the VCO 32 at which the output frequency therefrom is substantially equal to the difference in frequency between the selected component wave form and the narrow band channel 14. The memory and microprocessor unit 44 also provides the buffer storage necessary to individually process the frequency words relating to all of the component wave forms in accordance with the frequency segregated time domain output of the wide band channel 12.

For the hypothetical situation wherein the incoming signal includes six component wave forms having the frequency characteristics of 2.0, 2.1, 2.2, 2.3, 2.4, 2.5 GHz and the frequency parameters of the narrow band channel 14 are fixed to analyze a center frequency of 400 MHz., the following table is provided to assist in understanding the operation of the frequency matching means 28.

| Sweep No. of SLO 20 | Component Wave Form Frequency Characteristic in GHz | Frequency Output From VCO 32 in GHz | Frequency Output From Mixer 30 in MHz |
|---|---|---|---|
| 1 | 2.0 | 1.6 | 400 |
| 1 | 2.1 | 1.6 | 500 |
| 1 | 2.2 | 1.6 | 600 |
| 1 | 2.3 | 1.6 | 700 |
| 1 | 2.4 | 1.6 | 800 |
| 1 | 2.5 | 1.6 | 900 |
| 2 | 2.0 | 1.7 | 300 |
| 2 | 2.1 | 1.7 | 400 |
| 2 | 2.2 | 1.7 | 500 |
| 2 | 2.3 | 1.7 | 600 |
| 2 | 2.4 | 1.7 | 700 |
| 2 | 2.5 | 1.7 | 800 |
| 3 | 2.0 | 1.8 | 200 |
| 3 | 2.1 | 1.8 | 300 |
| 3 | 2.2 | 1.8 | 400 |
| 3 | 2.3 | 1.8 | 500 |
| 3 | 2.4 | 1.8 | 600 |
| 3 | 2.5 | 1.8 | 700 |
| 4 | 2.0 | 1.9 | 100 |
| 4 | 2.1 | 1.9 | 200 |
| 4 | 2.2 | 1.9 | 300 |
| 4 | 2.3 | 1.9 | 400 |
| 4 | 2.4 | 1.9 | 500 |
| 4 | 2.5 | 1.9 | 600 |
| 5 | 2.0 | 2.0 | 0 |
| 5 | 2.1 | 2.0 | 100 |
| 5 | 2.2 | 2.0 | 200 |
| 5 | 2.3 | 2.0 | 300 |
| 5 | 2.4 | 2.0 | 400 |
| 5 | 2.5 | 2.0 | 500 |
| 6 | 2.0 | 2.1 | −100 |
| 6 | 2.1 | 2.1 | 0 |
| 6 | 2.2 | 2.1 | 100 |
| 6 | 2.3 | 2.1 | 200 |
| 6 | 2.4 | 2.1 | 300 |
| 6 | 2.5 | 2.1 | 400 |

As shown in the above table, each sweep of the SLO 20 in the wide band channel 12 directs the segregated frequency characteristics of all six component wave forms to the video detector 38 at the input of the voltage control means 34. For the first sweep, the voltage control means 34 sets the output of VCO 32 at 1600 MHz which is the frequency required to beat the 2.0 GHz. component wave form down to the center frequency of 400 MHz. The frequency characteristic of the five other component wave forms are also beat down but not to the center frequency of 400 MHz. Therefore, as the result of the first sweep only the 2.0 GHz. component wave form will be analyzed by the narrow band channel 14. For each successive sweep of the SLO 20 thereafter, the voltage control means 34 sets the output of the VCO 32, so as to beat down another component wave form to the center frequency of 400 MHz. and after the sixth sweep, all of the component wave forms have been analyzed by the narrow band channel 14. Of course, the incoming signal could include more or less than six component wave forms and each component wave form could be continuously analyzed during more than one consecutive sweep of the SLO 20.

In another embodiment of the invention, the frequency matching means 28 directs its output from mixer 30, through a band-pass filter (hereinafter BPF) 48 to mixer 18. Consequently, the bandwidth of the component wave forms in the incoming signal at the input to the narrow band channel 14 is precisely defined.

Those skilled in the art will appreciate without any further explanation that many modifications and variations are possible to the above disclosed embodiments of signal analyzer apparatus within the concept of this invention. Consequently, it should be understood that all such modifications and variations fall within the scope of the following claims.

What we claim is:

1. Apparatus for analyzing signal wave forms, comprising:
   a wide band Chirp-Z channel having the sweeping local oscillator and filter frequency parameters thereof predetermined to derive the component wave forms of an incoming signal in a frequency segregated time domain;
   a narrow band Chirp-Z channel having the sweeping local oscillator and filter frequency parameters thereof predetermined to present a selected component wave form of the incoming signal with enhanced resolution; and
   means for matching the frequency characteristic of the selected component wave form to the frequency parameters of said narrow band channel in accordance with the relative position occupied by the frequency characteristic of the selected component wave form in the frequency segregated time domain of said wide band channel.

2. The apparatus of claim 1 wherein said frequency matching means includes a mixer and a voltage controlled oscillator, said mixer having the incoming signal and the frequency output from said voltage controlled oscillator applied thereto and having the output therefrom applied to the input of said narrow band channel, and said voltage controlled oscillator having its voltage input controlled in accordance with the relative position occupied by the frequency characteristic of the selected component wave form in the frequency segregated time domain of said wide band channel.

3. The apparatus of claim 2 wherein output from said mixer is directed to said narrow band channel through a band-pass filter to further define the frequency characteristic of the selected component wave.

4. The apparatus of claim 2 wherein said frequency matching means further includes means for controlling the voltage input to said voltage controlled oscillator in accordance with the difference in frequency between the selected component wave form and said narrow band channel.

5. The apparatus of claim 4 wherein said voltage control means further includes:
- a video detector having the component wave forms in the frequency segregated time domain of said wide band channel applied thereto and deriving frequency related pulses therefrom for each component wave form;
- a frequency/time counter and logic control unit having the frequency related pulses from said video detector applied thereto and deriving information therefrom to identify each component wave form in accordance with the relative position occupied thereby in the frequency segregated time domain of said wide band channel;
- a frequency word generator having the identifying information from said frequency/time counter and logic control unit applied thereto and deriving a digital code therefrom for each component wave form;
- a memory and microprocessor unit having the digital codes from said frequency word generator applied thereto and deriving a digital representation therefrom for a voltage level in accordance with the difference in frequency between the selected component wave form and said narrow band channel; and
- a digital-to-analog converter having the digital representation from said memory and microprocessor unit applied thereto and directing the analog voltage level therefor to said voltage controlled oscillator.

6. In a signal analyzer of the type wherein a wide band Chirp-Z channel has the sweeping local oscillator and filter frequency parameters thereof predetermined to derive the component wave forms of the signal in a frequency segregated time domain, the improvement comprising:
- a narrow band Chirp-Z channel having the sweeping local oscillator and filter frequency parameters thereof predetermined to present a selected component wave form of the signal with enhanced resolution; and
- means for matching the frequency characteristic of the selected component wave form to the frequency parameters of said narrow band channel in accordance with the relative position occupied by the frequency characteristic of the selected component wave form in the frequency segregated time domain of said wide band channel.

7. The signal analyzer of claim 6 wherein said frequency matching means includes a mixer and a voltage controlled oscillator, said mixer having the incoming signal and the frequency output from said voltage controlled oscillator applied thereto and having the output therefrom applied to the input of said narrow band channel, and said voltage controlled oscillator having its voltage input controlled in accordance with the relative position occupied by the frequency characteristic of the selected component wave form in the frequency segregated time domain of said wide band channel.

8. The signal analyzer of claim 7 wherein output from said mixer is directed to said narrow band channel through a band-pass filter to further define the frequency characteristic of the selected component wave form.

9. The signal analyzer of claim 7 wherein said frequency matching means further includes means for controlling the voltage input to said voltage controlled oscillator in accordance with the difference in frequency between the selected component wave form and said narrow band channel.

10. The signal analyzer of claim 9 wherein said voltage control means further includes:
- a video detector having the component wave forms in the frequency segregated time domain of said wide band channel applied thereto and deriving frequency related pulses therefrom for each component wave form;
- a frequency/time counter and logic control unit having the frequency related pulses from said video detector applied thereto and deriving information therefrom to identify each component wave form in accordance with the relative position occupied thereby in the frequency segregated time domain of said wide band channel;
- a frequency word generator having the identifying information from said frequency/time counter and logic control unit applied thereto and deriving a digital code therefrom for each component wave form;
- a memory and microprocessor unit having the digital codes from said frequency word generator applied thereto and deriving a digital representation therefrom for a voltage level in accordance with the difference in frequency between the selected component wave form and said narrow band channel; and
- a digital-to-analog converter having the digital representation from said memory and microprocessor unit applied thereto and directing the analog voltage level therefor to said voltage controlled oscillator.

* * * * *